(12) United States Patent
Paoletti et al.

(10) Patent No.: US 7,646,308 B2
(45) Date of Patent: Jan. 12, 2010

(54) SYSTEM FOR MONITORING ELECTRICAL EQUIPMENT AND PROVIDING PREDICTIVE DIAGNOSTICS THEREFOR

(75) Inventors: Gabriel J. Paoletti, Pennsauken, NJ (US); Thomas M. Nine, Chicago, IL (US); George M. Herman, Odgensburg, NJ (US); Mark T. Stephens, Boothwyn, PA (US); Robert Yanniello, Asheville, NC (US)

(73) Assignee: Eaton Corporation, Cleveland, OH (US)

( * ) Notice: Subject to any disclaimer, the term of this patent is extended or adjusted under 35 U.S.C. 154(b) by 259 days.

(21) Appl. No.: 11/928,335

(22) Filed: Oct. 30, 2007

(65) Prior Publication Data

US 2009/0109021 A1    Apr. 30, 2009

(51) Int. Cl.
G08B 21/00    (2006.01)
(52) U.S. Cl. ............... 340/635; 340/540; 340/588; 340/648; 340/657; 340/679; 340/682; 340/683; 702/104; 702/116; 702/184; 702/188
(58) Field of Classification Search ........... 340/635, 340/540, 588, 648, 657, 679, 682, 683, 870.17; 702/104, 116, 184, 188, 189
See application file for complete search history.

(56) References Cited

U.S. PATENT DOCUMENTS

| 5,485,491 | A | | 1/1996 | Salnick et al. |
| 5,917,428 | A | * | 6/1999 | Discenzo et al. ....... 340/870.01 |
| 5,999,583 | A | | 12/1999 | Pysnik et al. |
| 6,292,105 | B1 | | 9/2001 | Land, III et al. |
| 6,529,135 | B1 | * | 3/2003 | Bowers et al. ............. 340/648 |
| 6,839,660 | B2 | * | 1/2005 | Eryurek et al. ............. 702/188 |

OTHER PUBLICATIONS

Freshloc Technologies, "How FreshLoc Works", Freshloc in the news!, http://www.freshloc.com/FreshlocWorks.asp, 2007, 2 pp.
Freshloc Technologies, "Is FreshLoc Right for You?", Freshloc in the news!, http://www.freshloc.com/FreshlocRight.asp, 2007, 1 p.
Freshloc Technologies, "What Is FreshLoc?", Freshloc in the news!, http://www.freshloc.com/WhatIs.asp, 2007, 1 p.
Mikron Infrared, Inc., "SpyGlass™ Lens and ViewPorts", http://www.mikroninfrared.com/literature/SpyGlassLens.pdf, 2007, 4 pp.

(Continued)

Primary Examiner—Hung T. Nguyen
(74) Attorney, Agent, or Firm—Martin J. Moran

(57) ABSTRACT

A system monitors electrical equipment and provides predictive diagnostics therefor. The system includes sensors located at or about the electrical equipment. The sensors sense information pertaining to operation of the electrical equipment. A first processor is located at or about the electrical equipment and receives the sensed information from the sensors as first information. A first transceiver cooperates with the first processor to transmit the first information as transmitted information. A second processor is located remote from the electrical equipment. A second transceiver cooperates with the first transceiver to receive the transmitted information as second information and communicate the same to the second processor. The second processor provides a notification pertaining to an immediate inspection and/or maintenance of the electrical equipment, and set points operatively associated with the sensed information. The set points pertain to a number of potential alarms regarding operation of the electrical equipment.

22 Claims, 6 Drawing Sheets

OTHER PUBLICATIONS

Schneider Electric SA, "Square D Services for Schneider Electric Introduces Window of Opportunity", http://www.squared.com/us/services_support/squared_services.nsf/unid/720CFCDDFDEF04588625707400549FB4/$file/031705HVIR_main.htm, Mar. 17, 2005, 1 p.

Mikron Infrared, Inc., "SpyGlass™ Lens and ViewPorts", http://www.nor-pro.dk/SpyGlassViewPort.pdf, 2007, 2 pp.

Land, III, H. B., et al., "Evolution of Arc Fault Protection Technology at APL", Johns Hopkins APL Technical Digest, vol. 25, No. 2 (2004), pp. 140-153.

Paoletti, G., et al., "Failure Contributors of MV Electrical Equipment and Condition Assessment Program Development", IEEE, May 23, 2002, 12 pp.

Upward Innovations, Inc., "Solarstream wireless data transceiver", http://www.upwardinnovations.com/upward/SOLARSTREAM_specs.pdf, 2007, 2 pp.

Onset Computers, "HOBO® H22 Energy Logger Pro Data Logger Part # H22-001", http://www.onsetcomp.com/solutions/products/loggers/_loggerviewer.php5?pid=409, 2007, 2 pp.

The Institute of Electrical and Electronics Engineers, Inc., IEEE Recommended Practice for Design of Reliable Industrial and Commercial Power Systems, "ISBN 1-55937-969-3", Aug. 1998, 4 pp.

Upward Innovations, Inc., "Solarstream wireless data transceiver", upwardinnovations.com/products, 2005, 1 p.

\* cited by examiner

SYSTEM FOR MONITORING ELECTRICAL EQUIPMENT AND PROVIDING PREDICTIVE DIAGNOSTICS THEREFOR

BACKGROUND OF THE INVENTION

1. Field of the Invention

This invention pertains generally to systems for electrical equipment and, more particularly, to such systems that monitor and provide predictive diagnostics for electrical equipment. The invention also pertains to systems that monitor and provide predictive diagnostics for electrical or rotating electrical equipment.

2. Background Information

Today, electrical equipment users are being stretched to do more with less. This translates into lower maintenance budgets and an operating mode of "outages are no longer an option". Electrical equipment is conventionally maintained on a periodic basis. Known predictive technology for electrical equipment includes thermographic, ultrasonic and partial discharge detection and inspections.

Thermographic and ultrasonic detection are applied at all voltage levels, while partial discharge detection is applied to medium voltage systems. Ultrasonic and partial discharge inspections detect the presence of low-level arcing or corona, which can increase in some cases and result in electrical insulation damage. Thermographic inspections identify "overheated" electrical connections or electrical components within electrical equipment. Loose or deteriorated electrical connections or electrical components will operate at higher temperatures and can be detected when viewing the infrared spectrum of light, visible via thermograph cameras. The temperature of electrical conductors, including electrical connections and electrical components is directly related to the amount of load current that is being transmitted. Therefore, these inspections must be performed while the electrical equipment is energized and loaded. At the same time, varying electrical loads will result in varying operating temperatures for electrical connections; hence, the level of current loading needs to be factored into the analysis.

Thermographic inspections require the opening of front and rear doors while the electrical equipment is energized. The opening of such doors must be accomplished with extreme care, and in some cases should not be performed due to potential safety risks to personnel. For example, a person removing a panel cannot be certain of the distance between a grounded metal door and an energized bus within an electrical equipment enclosure. If an accidental slip of the door occurs, then a faulted condition could result in extremely close proximity to the individual.

There has been a recent proposal in the sensing of overheated electrical connections or other electrical components. One such proposal allows for remote viewing of the infrared spectrum remotely by a permanently mounted camera. The emphasis on personal safety, and newly proposed arc flash standards, has resulted in greater use of "infrared-windows" which allows viewing of infrared radiation through pre-installed infrared-ports. For example, a known thermographic camera provides a "UL recognized latched-port" (⅝ in.) opening to allow an infrared camera's relatively wide-angle to view the inside of the electrical equipment without opening the outer doors.

Another proposal applies permanent temperature sensors to electrical connections or other energized locations and wirelessly transmits the measured temperature to a receiver, which is then connected to a computer for trending, alarming and analysis. Such permanent temperature sensors may operate from internal batteries and, therefore, require that the batteries be changed, which is only possible by a complete shutdown of the electrical equipment. These additional shutdowns to maintain the integrity of the temperature monitoring system is not preferred by end users, which need to operate for relatively longer periods of time at greater levels of reliability. These known systems also do not correlate measured temperatures to other parameters and, thus, do not provide indications of required maintenance based on temperatures or other factors such as dust, smoke and humidity, which appear normal in absolute values, but are actually high, based on historical trended levels, or high for the level of current flow through such electrical connections or other electrical components.

U.S. Pat. No. 5,485,491 discloses an online system for diagnosing operating conditions of a motor, in order to determine when motor maintenance is required. Motor sensors monitor various physical parameters (e.g., non-electrical or insulation-related conditions) and produce corresponding electrical signals. Signal converters transform the electrical signals to corresponding digital values. These values are collected by a processor which compares the values, or a trend of the values, with predetermined baseline values, or trends, associated with a newly manufactured or refurbished motor. The processor then makes recommendations for a motor maintenance interval, in order to provide optimum motor performance and availability at minimum cost and downtime. The motor maintenance interval is a specific time or, alternatively, a more general time, such as the time of the next scheduled refueling outage. In the case of a reactor coolant pump (RCP) motor within a nuclear containment vessel, an intermediate data storage device collects the digital values corresponding to the electrical signals and communicates the digital values to a processor which is remotely located (e.g., beyond a biological barrier, beyond the containment vessel, at an off-site location, etc.) from the RCP motor.

There is room for improvement in systems for electrical equipment.

There is also room for improvement in systems for electrical or rotating electrical equipment.

SUMMARY OF THE INVENTION

There is now a much greater need and desire for "predictive maintenance" whereby electrical equipment is evaluated while being energized and operating. This results in outages being planned and maintenance being performed only on electrical equipment in need, rather than the traditional across-the-board maintenance of entire systems. Hence, there is also a need to retrofit existing electrical equipment with "predictive tools" as well as provide such tools on new electrical equipment. Predictive tools provide an early warning of an immediate or potential failure and the need for near-term maintenance to either prevent a pending failure or to prolong the life of the electrical equipment.

These needs and others are met by embodiments of the invention, which address both the need to identify immediate or potential failures of electrical equipment and, also, the need for immediate inspections and/or maintenance to be performed. The combination of these two functions help to satisfy end-user needs to operate electrical equipment more continuously for relatively longer periods of time, thereby improving overall production efficiency at reduced costs, and can effectively change the current process of time-based or usage-based maintenance or inspection cycles.

In accordance with embodiments of the invention, a system monitors, trends, analyzes and transmits early warning signals or indications of the need for immediate inspections and/or maintenance of associated electrical equipment. The system obtains a set of locally monitored parameters and remotely transmits these parameters for remote engineering analysis through, for example, site-specific algorithms to provide for indication of the need for immediate service and/or maintenance, in addition to providing immediate notification of specific alarm conditions. Cellular or land-line technology may be employed to bypass firewalls and other Internet transmission security issues. Internet transmission may be employed for in-house systems or acceptable firewall data transfer protocols. The system may monitor key failure indicators such as, for example and without limitation, humidity, dust, smoke, excessive temperature, ground leakage current, floor water, motion, excessive load current and power quality events. The system may employ algorithms developed by expert analysis such as, for example and without limitation, web-based intelligent software to compare temperature to actual load current and other parameters and develop correlations of these, and other failure indicators, with each other. The system may also analyze historical data to develop maximum operating temperatures, above which, alarms will indicate the need for inspections and/or maintenance.

The system preferably provides continuous monitoring of local operating parameters, equipment and environmental conditions combined with remote diagnostics and analysis through site-specific algorithms to identify two critical needs for end-users of electrical equipment. These critical needs are satisfied through: (a) alarms or other immediate notifications of pending or potentially pending electrical equipment failures; and (b) identifying the need for inspections or maintenance during normal or abnormal operating conditions.

Each end-user system preferably operates with a unique set of loading and environmental conditions and, therefore, site-specific algorithms are provided based on corresponding historical data to predict normal operating air temperatures of the electrical equipment. These site-specific algorithms correlate temperature to various other parameters such as, for example and without limitation, electrical load current, humidity, dust, ambient temperatures and other parameters, and help to identify the need for inspections and maintenance prior to temperatures reaching specific absolute levels. Other parameters may also be correlated such as dust to ambient temperatures, or ambient temperatures to daily fluctuations in electrical loads or monthly or yearly fluctuating load changes.

In accordance with one aspect of the invention, a system for monitoring electrical equipment and providing predictive diagnostics therefor comprises: a number of sensors located at or about the electrical equipment, the number of sensors being structured to sense information pertaining to operation of the electrical equipment; a first processor located at or about the electrical equipment, the first processor being structured to receive the sensed information from the number of sensors as first information; a first transceiver cooperating with the first processor to transmit the first information as transmitted information; a second processor located remote from the electrical equipment; and a second transceiver cooperating with the first transceiver to receive the transmitted information as second information and communicate the same to the second processor, wherein the second processor is structured to provide at least one of: (a) a notification pertaining to an immediate inspection and/or maintenance of the electrical equipment; and (b) a number of set points operatively associated with the sensed information, the number of set points pertaining to a number of potential alarms regarding operation of the electrical equipment.

The second processor may be further structured to output an alarm pertaining to an immediate or potential failure of the electrical equipment resulting from at least one of: (a) dust, (b) smoke, (c) water, (d) humidity and (e) a combination of at least two of humidity, temperature, water, smoke and dust.

The number of sensors may be further structured to sense as the sensed information: (a) equipment temperature and load current of the electrical equipment, and (b) at least one of ambient temperature, humidity and dust about the electrical equipment; and an expert system may be structured to correlate the equipment temperature to the load current and the at least one of the ambient temperature, the humidity and the dust, in order to provide a unique corresponding equipment operating profile for the electrical equipment as a function of variable conditions and operating modes thereof.

The second processor may be further structured to provide trend information of the second information with respect to time; and the expert system may be further structured to employ the trend information to predict normal operating equipment temperatures of the electrical equipment and to provide an alarm or notification if the electrical equipment operates beyond the predicted normal operating equipment temperatures.

The second processor may be further structured to cooperate with the second transceiver to transmit the number of set points to the first transceiver as a number of transmitted set points; the first transceiver may be structured to receive the number of transmitted set points as a number of received set points; and the first processor may be further structured to compare a number of the first information to the number of received set points and provide a number of alarms, which indicate need for inspection or maintenance of the electrical equipment.

The first processor may be structured to provide at least one of: (a) an alarm pertaining to an immediate or potential failure of the electrical equipment; and (b) a notification pertaining to an immediate inspection and/or maintenance of the electrical equipment.

As another aspect of the invention, a system for monitoring electrical or rotating electrical equipment and providing predictive diagnostics therefor comprises: a number of sensors located at or about the electrical or rotating electrical equipment, the number of sensors being structured to sense information pertaining to operation of the electrical or rotating electrical equipment; a first processor located at or about the electrical or rotating electrical equipment, the first processor being structured to receive the sensed information from the number of sensors as first information; a first transceiver cooperating with the first processor to transmit the first information as transmitted information; a second processor located remote from the electrical or rotating electrical equipment; and a second transceiver cooperating with the first transceiver to receive the transmitted information as second information and communicate the same to the second processor, wherein the second processor is structured to determine a number of set points operatively associated with the sensed information, the number of set points pertaining to a number of potential alarms regarding operation of the electrical or rotating electrical equipment.

The second processor may be further structured to cooperate with the second transceiver to transmit the number of set points to the first transceiver as a number of transmitted set points; the first transceiver may be structured to receive the number of transmitted set points as a number of received set points; and the first processor may be further structured to compare a number of the first information to the number of received set points and provide a number of alarms regarding operation of the electrical or rotating electrical equipment.

The second processor may be further structured to provide an alarm pertaining to an immediate or potential failure of the electrical or rotating electrical equipment.

The second processor may be further structured to provide a notification pertaining to an immediate inspection and/or maintenance of the electrical or rotating electrical equipment.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term electrical equipment means indoor and/or outdoor electrical equipment; electrical control equipment; circuit interrupters such as, for example and without limitation, circuit breakers, reclosers, network protectors and electrical switches; power busses; bus-ducts; busways; electric meters; transformers; switchboards; uninterruptible power supplies (UPSs); power distribution units (PDUs); and electrical distribution apparatus and/or equipment such as, for example and without limitation, load centers, panelboards, motor control centers, motor starters, and low voltage and medium voltage switchgear, but expressly excluding motors, generators and other rotating electrical apparatus.

As employed herein, the term rotating electrical apparatus means motors, generators and other rotating electrical apparatus having a number of operating parameters.

As employed herein, the term "electrical or rotating electrical equipment" means electrical equipment or rotating electrical apparatus.

Figure 1:
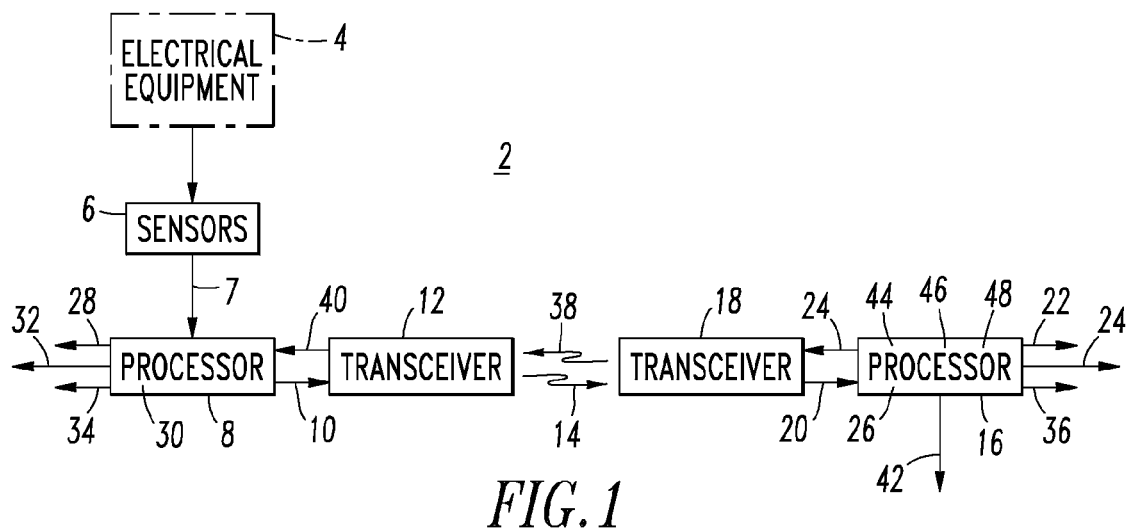
FIGS. 1-3 are block diagrams of condition monitoring systems in accordance with embodiments of the invention.

Referring to FIG. 1, a system 2 monitors electrical equipment 4 (shown in phantom line drawing) and provides predictive diagnostics therefor. The system 2 includes a number of sensors 6 located at or about the electrical equipment 4. The sensors 6 are structured to sense information 7 pertaining to operation of the electrical equipment 4. A first processor 8 is located at or about the electrical equipment 4 and is structured to receive the sensed information 7 from the sensors 6 as first information 10. A first transceiver 12 cooperates with the first processor 8 to transmit the first information 10 as transmitted information 14. A second processor 16 is located remote from the electrical equipment 4. A second transceiver 18 cooperates with the first transceiver 12 to receive the transmitted information 14 as second information 20 and communicate the same to the second processor 16. In accordance with an important aspect of the invention, the second processor 16 is structured to provide at least one of: (a) a notification 22 pertaining to an immediate inspection and/or maintenance of the electrical equipment 4; and (b) a number of set points 24 operatively associated with the sensed information 7 and pertaining to a number of potential alarms 26 regarding operation of the electrical equipment 4.

EXAMPLE 1

The first and second transceivers 12,18 are structured to communicate through one of the group consisting of a global communication network (e.g., the Internet), a cellular telephone network, and a wired telephone network.

EXAMPLE 2

The first processor 8 is structured to periodically receive the sensed information 7 from the number of sensors 6. The first transceiver 12 is structured to periodically transmit the transmitted information 14 to the second transceiver 18.

EXAMPLE 3

The first processor 8 is structured to provide a number of notifications 28 responsive to the number of alarms 26. In this example, the alarms 26 are communicated from the second processor 16 to the first processor 8 by the transceivers 18,12. Alternatively, a number of alarms 30 may be provided by the first processor 8, in which case the number of notifications 28 are responsive to the number of alarms 30.

EXAMPLE 4

The number of notifications 22,28 are selected from the group consisting of a pager message, a text message, and an e-mail message.

EXAMPLE 5

The notifications 22,28 may provide, for example and without limitation, at least one of a notification to an operator of the electrical equipment 4 and a notification to a service person for the electrical equipment 4.

EXAMPLE 6

The first processor 8 is structured to be a web client, the second processor 16 is structured to be a web server, and the first and second transceivers 12,18 are structured to communicate through a global communication network.

EXAMPLE 7

The first processor 8 is structured to provide at least one of an alarm 32, which may pertain to an immediate or potential failure of the electrical equipment 4, and a notification 34 pertaining to an immediate inspection and/or maintenance of the electrical equipment 4.

EXAMPLE 8

The second processor 16 is structured to output the alarm 26 at output 36. The sensors 6 in this example pertain to dust, smoke, humidity, temperature and water in or about the electrical equipment 4. The second processor 16 provides the alarm 26 based upon determining an immediate or potential failure of the electrical equipment 4 resulting from at least one of: (a) dust, (b) smoke, (c) water, (d) humidity and (e) a combination of at least two of humidity, temperature, water, smoke and dust. For example, the sensed information 7 from those sensors 6 have reached levels, based on either algorithms of the second processor 16 or maximum historical levels stored by the second processor 16, that could result in pending failure modes of the electrical equipment 4 within a number of days to a number of months.

EXAMPLE 9

The second processor 16 is structured to cooperate with the second transceiver 18 to transmit the number of set points 24 to the first transceiver 12 as a number of transmitted set points 38. The first transceiver 12 is structured to receive the number of transmitted set points 38 as a number of received set points 40, and the first processor 8 is structured to compare a number of the first information 10 to the number of received set points 40 and provide a number of the alarms 32, which may be regarding operation of the electrical equipment 4.

EXAMPLE 10

The second processor 16 is structured to provide trend information 42 of the second information 20 with respect to time.

EXAMPLE 11

The second processor 16 is structured to provide from the trend information 42 at least one of the number of set points 24, and a recommendation 44 regarding an inspection or maintenance of the electrical equipment 4.

EXAMPLE 12

The second processor 16 includes an expert system 46 employing the trend information 42 and the second information 20.

EXAMPLE 13

The second processor 16 is structured to provide the trend information 42 with respect to time. The expert system 46 is structured to employ the trend information 42 to predict normal operating equipment temperatures of the electrical equipment 4 and to provide an alarm 26 or notification 22 if the electrical equipment 4 operates beyond its predicted normal operating equipment temperatures.

EXAMPLE 14

The second processor 16 includes a human interface 48 to the trend information 42 and the second information 20.

EXAMPLE 15

The second processor 16 is structured to provide from the trend information 42 the number of set points 24, which pertain to at least one of a maximum operating temperature, a maximum level of dust, a maximum level of humidity and a maximum level of smoke of the electrical equipment 4.

EXAMPLE 16

The first processor 8 is structured to compare a number of the first information 10 to the number of received set points 40 and provide a number of the alarms 32, which may indicate need for inspection or maintenance of the electrical equipment 4.

EXAMPLE 17

The sensors 6 are structured to sense as the sensed information 7: (a) equipment temperature and load current of the electrical equipment 4, and (b) at least one of ambient temperature, humidity and dust about the electrical equipment 4. The expert system 46 of the second processor 16 is structured to correlate the equipment temperature to the load current and the at least one of the ambient temperature, the humidity and the dust, in order to provide a unique corresponding equipment operating profile for the electrical equipment 4 as a function of variable conditions and operating modes thereof.

EXAMPLE 18

Figure 2:
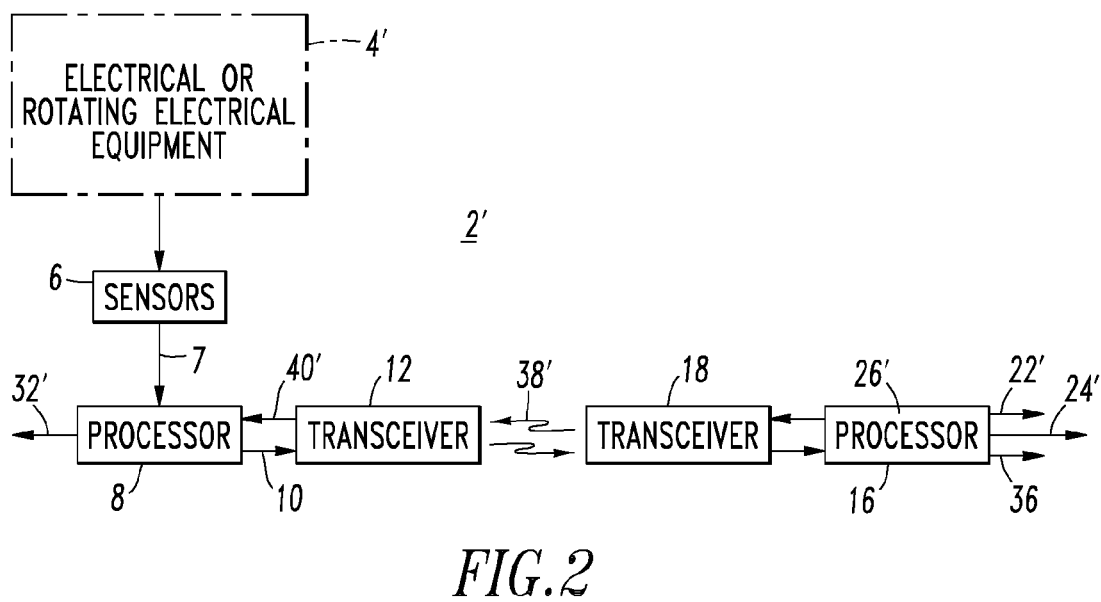

Referring to FIG. 2, another system 2' monitors electrical or rotating electrical equipment 4' (shown in phantom line drawing) and provides predictive diagnostics therefor. Otherwise, the system 2' is generally the same or similar to the system 2 of FIG. 1. The second processor 16 is structured to determine a number of set points 24' operatively associated with the sensed information 7. The number of set points 24' pertain to a number of potential alarms 26' regarding operation of the electrical or rotating electrical equipment 4'.

EXAMPLE 19

The second processor 16 of FIG. 2 is structured to cooperate with the second transceiver 18 to transmit the number of set points 24' to the first transceiver 12 as a number of transmitted set points 38'. The first transceiver 12 is structured to receive the number of transmitted set points 38' as a number of received set points 40', and the first processor 8 is structured to compare a number of the first information 10 to the number of received set points 40' and provide a number of the alarms 32', which may be regarding operation of the electrical or rotating electrical equipment 4'.

EXAMPLE 20

The second processor 16 is structured to output an alarm 26' at output 36, which pertains to an immediate or potential failure of the electrical or rotating electrical equipment 4'.

EXAMPLE 21

The second processor 16 is structured to provide a notification 22' pertaining to an immediate inspection and/or maintenance of the electrical or rotating electrical equipment 4'.

EXAMPLE 22

Figure 3A:
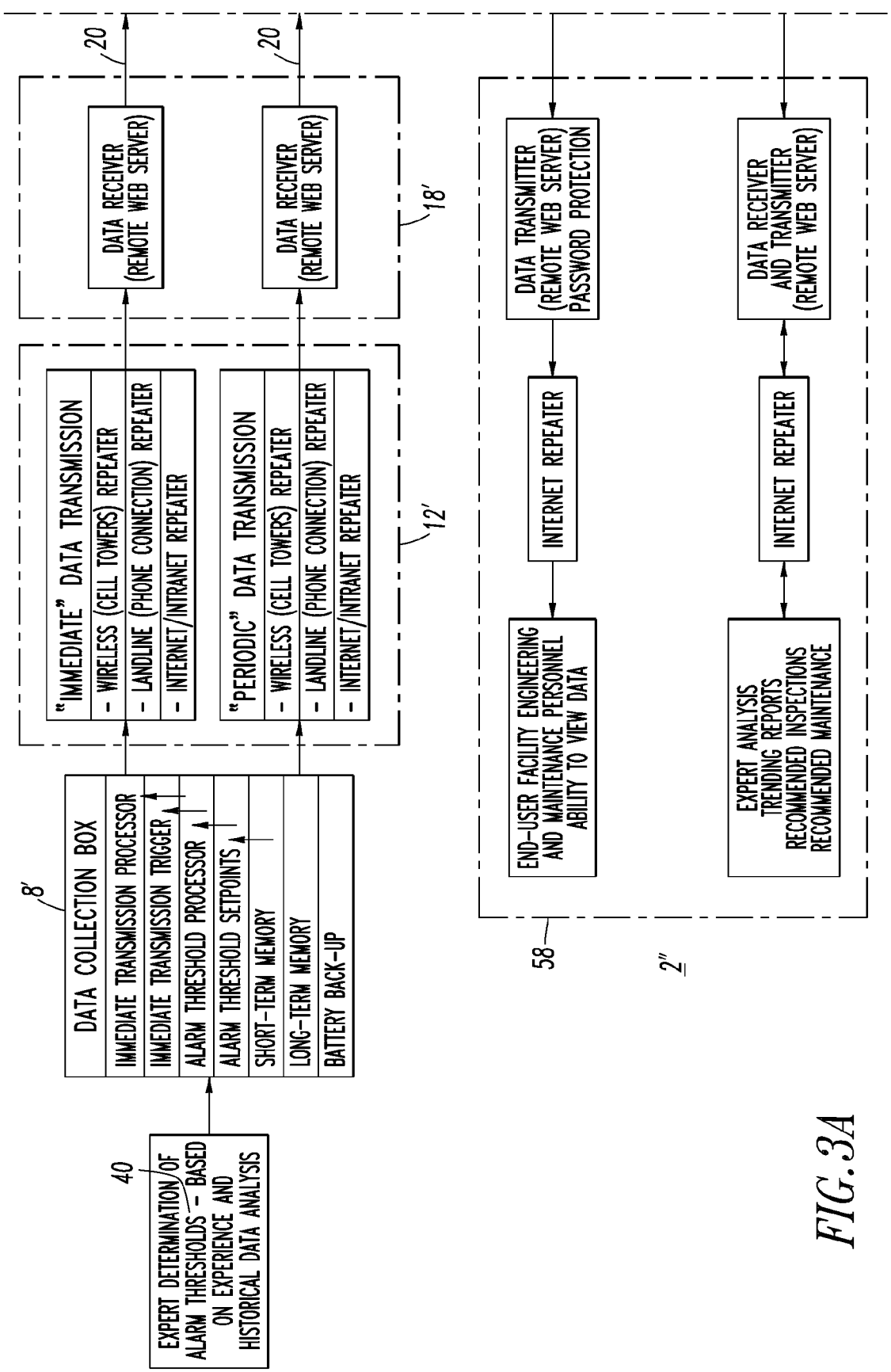
Figure 3B:
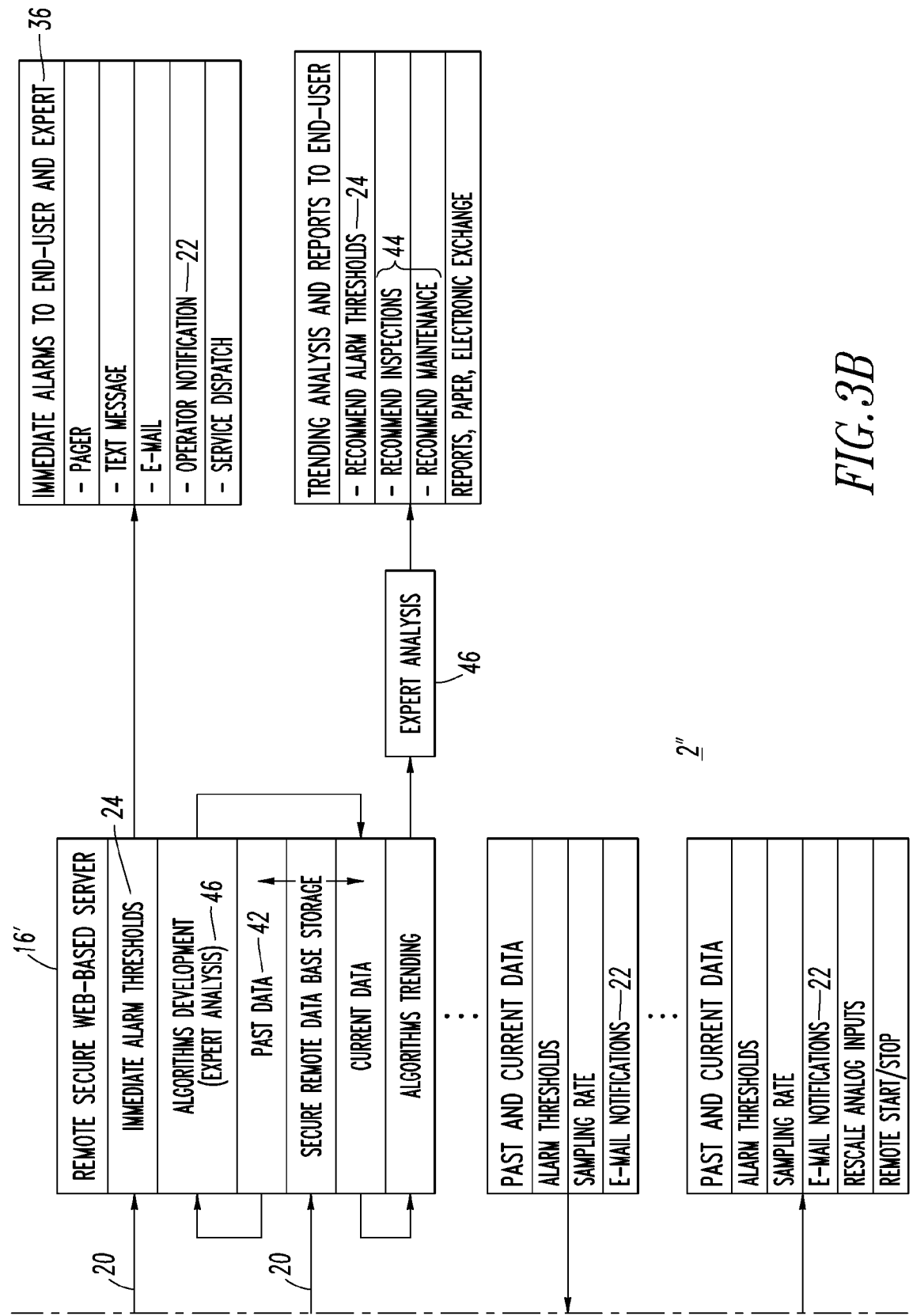

Referring to FIG. 3, an example communication technique employed by system 2" and transceivers 12',18' uploads data from a first processor 8' (e.g., without limitation, a data-logger; a data collection box) through wireless communication to a local repeater, which sends information via a global communication network, such as the Internet, to a second processor 16' (e.g., without limitation, a remote web server). The web server may be accessed through a suitable user interface 58 by the end user through the Internet to, for example, view data, edit alarm thresholds 24, edit e-mail notifications 22, change sampling rates, or rescale analog inputs. Preferably, suitable known information technology measures are taken at the web server to provide, for example, a firewall.

The system 2 of FIG. 1 may include some or all of the functions provided by the system 2" of FIG. 3.

Conventional equipment may be employed to gather data from the sensors 6 (FIG. 1) and transmit that data to the secure web-site. For example, a suitable data-logger including a number of suitable temperature and humidity sensors is a Hobo® Energy Logger Pro marketed by Onset Computer Corporation of Bourne, Mass. Other suitable sensors, such as for example and without limitation, for dust, motion, 4-20 mA input, alternating current (AC) current, AC voltage and direct current (DC) voltage, may be integrated with that data-logger.

A suitable wireless data transceiver for sending data from and to the data-logger is a SOLARSTREAM™ wireless data transceiver marketed by Upward Innovations Inc. of East Falmouth, Mass. This transceiver automatically transmits data to a secure Internet server and provides alerts (via e-mail or text messages) of user-defined alarm conditions, such as temperature or moisture. Users can access remote data securely from any Internet-enabled computer. From password-protected accounts, users can view or download data using a secure encrypted connection, or change parameters at the data-logger, such as logging interval and server update rate.

EXAMPLE 23

Examples of various locally monitored criteria and/or corresponding types of the sensors 6 (FIG. 1) include detection of undesirable ground current (e.g., from the secondary output of a zero sequence ground sensing current transformer (CT) or from the residual of three-phase CTs via the measurement of the current flow from the common connection of three CTs to a ground connection, in order to detect a growing leakage current either within a downstream load or within the electrical equipment 4); ion (smoke) detection (e.g., within low voltage switchgear; above switchgear in low voltage, medium voltage or motor control center applications including switches and panelboards; to detect any overheated insulation materials or nearby smoke); ambient temperature (e.g., near the electrical equipment 4; for input by algorithms of the expert system 46 to determine the need for immediate or short-term inspections and/or maintenance); dust (e.g., to identify and predict the level of contamination, which can cause electrical failures or the need for immediate or short-term inspections and/or maintenance; in the area of the electrical equipment 4; near air flow vents; to sense the presence of particles related to smoke or deteriorating insulation); humidity (e.g., to identify the level of moisture in and around the electrical equipment 4, which can cause failures); electrical load current (e.g., through the output of existing CTs; to identify load levels near full-load and for use as a critical input to site-specific algorithms of the expert system 46); floor water (e.g., at or near the electrical equipment 4; to determine if external events may subject the electrical equipment 4 to potential failure); motion detection (e.g., at, about or within the electrical equipment 4; to determine the presence of personnel or animals near the electrical equipment 4); and/or 4-20 ma or DC voltage inputs (e.g., for sensing power quality incidents as recorded by power quality and/or power usage meters or relays (e.g., power surges, sags and harmonics are examples of power quality related inputs that can both identify the need for immediate action or longer term overloading of the electrical equipment 4 from both harmonic heating and voltage surge stresses); the operation of critical circuit breakers (e.g., which indicate a condition requiring immediate attention (e.g., a main circuit breaker opening due to loss of incoming voltage or downstream faults; an emergency generator circuit breaker closing; an automatic tie circuit breaker closing)); internal temperature of the electrical equipment 4 (e.g., of individual compartments or individual cubicles as required by the application; for comparison to calculated values based on site-specific and/or application-specific algorithms of the expert system 46; for sensing higher than normal temperatures that suggest the need for immediate or short-term inspections and/or maintenance); and date/time stamp for data capture.

EXAMPLE 24

As discussed above, various algorithms of the expert system 46 are employed to predict internal temperatures and other operating parameters of the electrical equipment 4. Examples of site-specific variables include: level of current loading versus full load ratings; air flow levels to remove heating affects; amount of dust to prevent heat transfer; and temperature rise time constant of the specific site environment and the electrical equipment 4 and the specific application of the rate of load current increases or decreases.

EXAMPLE 25

Figure 4:
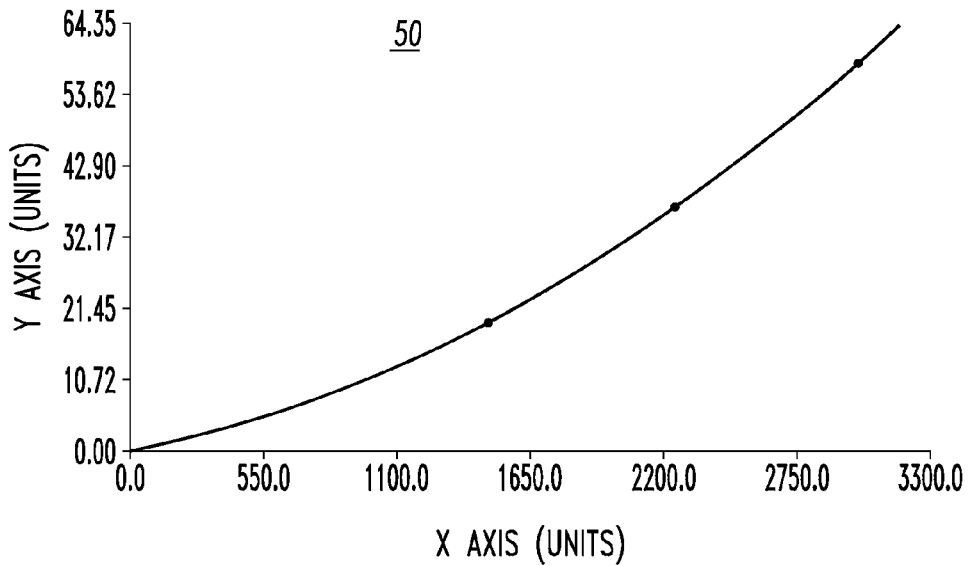
FIG. 4 is a plot of an algorithm that correlates the "rise in temperature over ambient" to match particular site-specific and application-specific environments in accordance with embodiments of the invention.

An example of an algorithm 50 of the expert system 46 (FIG. 1) to match a particular site-specific and application-specific environment is shown in FIG. 4. The example algorithm 50 correlates, for example, the "rise in temperature over ambient".

For example, in Equation 1, below, current may affect coefficients "a" and "c" with airflow, and temperature time constants may affect coefficient "b". A series of curve-fitting, regression and analysis programs of the second processor 16 (FIG. 1) may be employed to match as many as six to eight, or more, parameters to create an accurate algorithm for predicting potential failures and providing notifications of the need for immediate inspection and/or maintenance.

$$y = a + bx_1 + cx_2^2 \tag{Eq. 1}$$

wherein:

y is expected cubicle or section temperature based on the algorithm calculation, which is based on historical collected data;

$x_1$ is ambient temperature;
$x_2$ is load current;
a is a constant, such as −0.0040576;
b is a constant, such as 0.0064362; and
c is a constant, such as 0.0000044.

In this example, a, b and c are suitable example constants developed based on expert analysis of historical collected data, including, for example and without limitation, the use of curve fitting software or other known or conventional curve fitting mathematics or techniques. Equation 1 provides an example of an expected temperature of a cubicle or enclosure based on the analysis of ambient temperature and load current over time. This expected temperature is, then, compared with the actual temperature of the cubicle, as measured by the first processor 8 from a suitable temperature sensor on an ongoing basis. This allows for an alarm 26 and/or notification 22 of actual temperature exceeding the expected, or calculated, temperature. Although temperatures and load current variables are included in this example, other variables may be evaluated in addition to or in place of those variables, such as for example and without limitation, humidity, and levels of dust and/or smoke.

Another critical end-user need, which the disclosed system 2 addresses, is the notification 22 for required inspections and/or maintenance. This is shown by the use of algorithms of the expert system 46 to predict the presence of deteriorated or loose electrical connections or electrical components before they reach absolute temperature levels. Examples 26-29, below, show the use of such algorithms.

EXAMPLE 26

Figure 5:
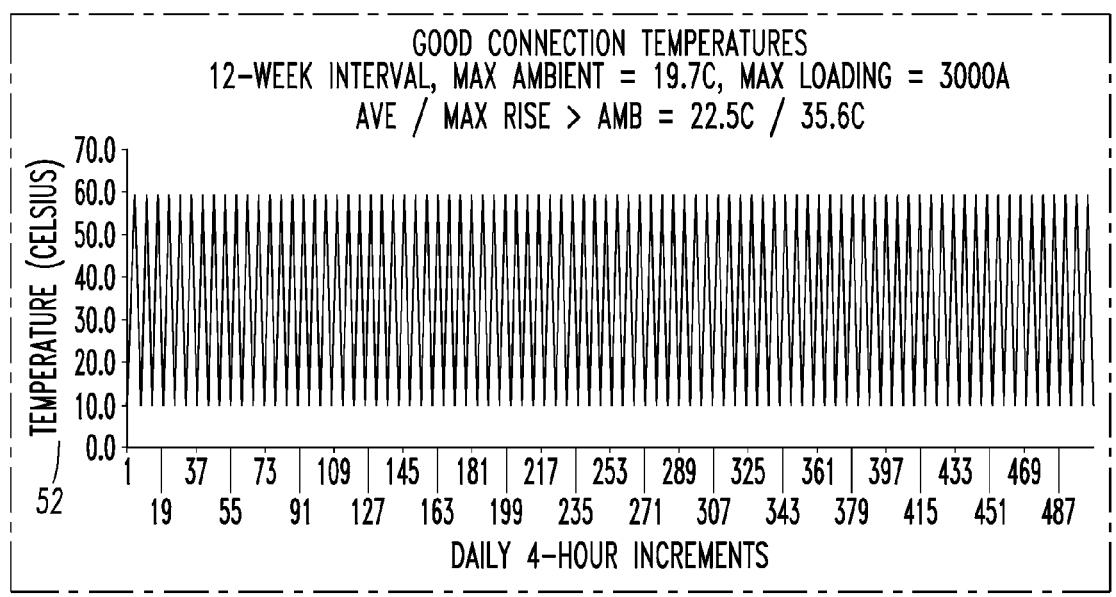
FIG. 5 is a plot of varying load current and corresponding temperatures over a period of time in accordance with embodiments of the invention.

FIG. 5 plots the results of a varying load current and a corresponding varying temperature 52 over an example twelve week period. In this example, the maximum temperature of about 608 C may be considered normal due to the maximum load current level of about 3000 amperes.

Figure 6:
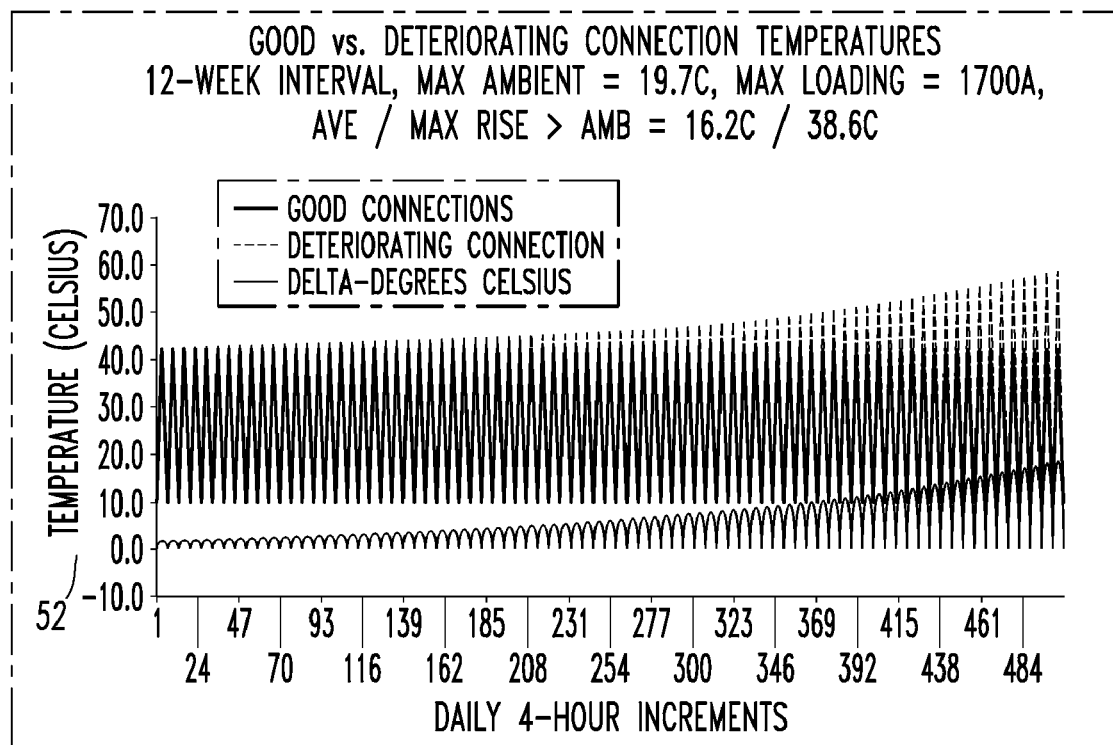
FIG. 6 is a plot of varying load current and corresponding temperatures over a period of time in which the temperature is due to a deteriorating electrical connection in accordance with embodiments of the invention.

In contrast, another location, which has a varying load current as shown in FIG. 6, with a maximum of about 1700 amperes, also indicates the same or similar temperature of about 608 C at the end of a three-month period, but in this instance, the temperature is due to a deteriorating electrical connection.

A more specific example is the rear spring-loaded finger clusters or electrical connectors of a circuit breaker or motor control center starter bucket assembly. These spring-loaded copper finger clusters or electrical connectors are also coated with a thin film of silver plating. When operated under high load conditions, or simply due to aging, the springs may begin to lose tension. Just lost of tension will result in a high impedance electrical connection between the electrical bus and the spring-loaded finger cluster or electrical connectors. This high impedance begins to generate relatively higher temperatures, which can further deteriorate the silver plating material, which further increases the impedance and the temperature. This process can continue for weeks or months without detection.

Periodic manual thermographic surveys would have to be timed at, or very near, this pending failure mode. The temperatures will continue to rise slowly around the finger cluster or electrical connector. This increased temperature will increase the overall temperature of the enclosure for the electrical equipment 4 (FIG. 1) only slightly and would not be detectable as a "high temperature" without the use of an algorithm based on historical data.

The disclosed system 2 identifies this potential failure mode and notifies the end-user, through notification 22 (FIG. 1), that an immediate inspection or maintenance cycle is required. The end-user can then schedule an outage for a thermographic survey, in order to complete an internal inspection, maintenance, testing and correction of the deteriorated finger cluster or electrical connector.

If this condition is left undetected, then the higher temperatures will begin to overheat the surrounding and nearby insulation material. This overheating of the insulation material will result in the release of carbon, or other airborne materials. These airborne materials normally then rise up and deposit on other insulation, eventually creating a path to ground of the energized bus, thereby resulting a major fault within the electrical equipment 4. Here, the root cause is an overheated finger cluster or connector, but the actual failure initiation is other electrical equipment above this overheated connector, where the carbon or other material deposited and created a path to ground for the energized electrical equipment 4.

EXAMPLE 27

For example, thermographic surveys are conducted as individual surveys to identify existing problems. In Example 26, above, if the temperature was balanced across all three phases of a three-phase power bus due to similar deterioration of electrical connections, then this deteriorating electrical equipment 4 might be misdiagnosed as satisfactory. Permanent temperature sensors will also not identify this deteriorating condition without employing algorithms to reflect historical performance before deterioration. The system 2 employs past data as part of the site-specific algorithms, such as 50 (FIG. 4), and applies these algorithms to current data, thereby identifying deteriorating electrical equipment 4 while in service under normal conditions.

EXAMPLE 28

Figure 7:
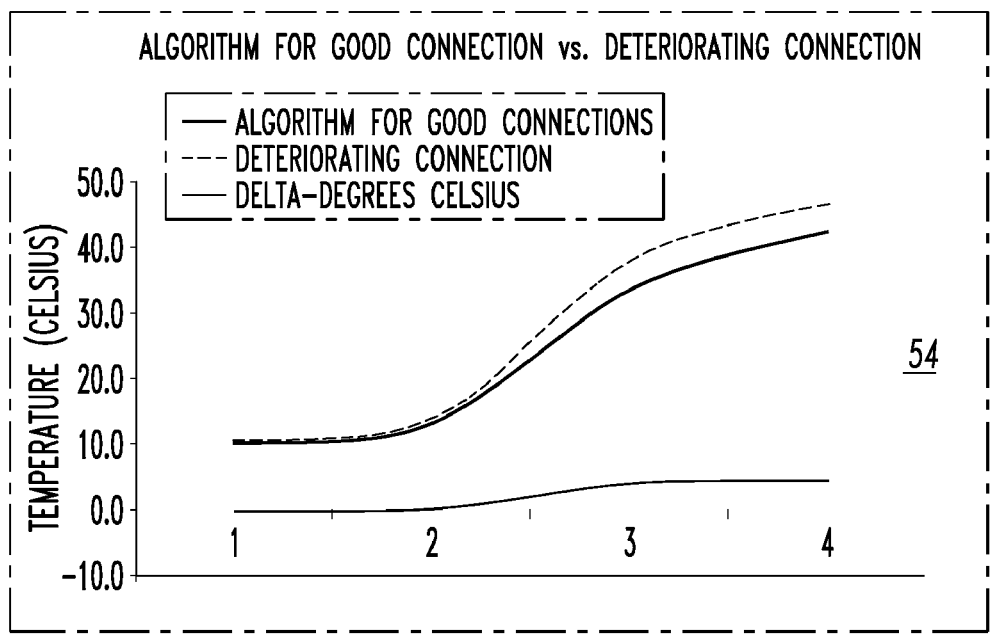
FIG. 7 is a plot of an algorithm based upon historical data for a non-deteriorating electrical connection or electrical component as contrasted with current data of a deteriorating electrical connection or electrical component in accordance with embodiments of the invention.

FIG. 7 shows an algorithm 54 created from past data for a non-deteriorating electrical connection or electrical component as contrasted with the current data of the deteriorating electrical connection or electrical component. The past data is reviewed and the algorithm 54 is updated periodically by the second processor 16, with the average update period being about three months in duration, although relatively more critical electrical equipment 4 may be updated more frequently and relatively less critical electrical equipment may be updated less frequently.

EXAMPLE 29

The system 2 includes the analysis of past data to determine maximum temperatures for specific locations within the electrical equipment 4. When above a maximum temperature for a corresponding specific location, an alarm 26 or a number of recommendations 44 are provided to perform either an immediate inspection or to schedule an immediate or short-term maintenance.

Figure 8:
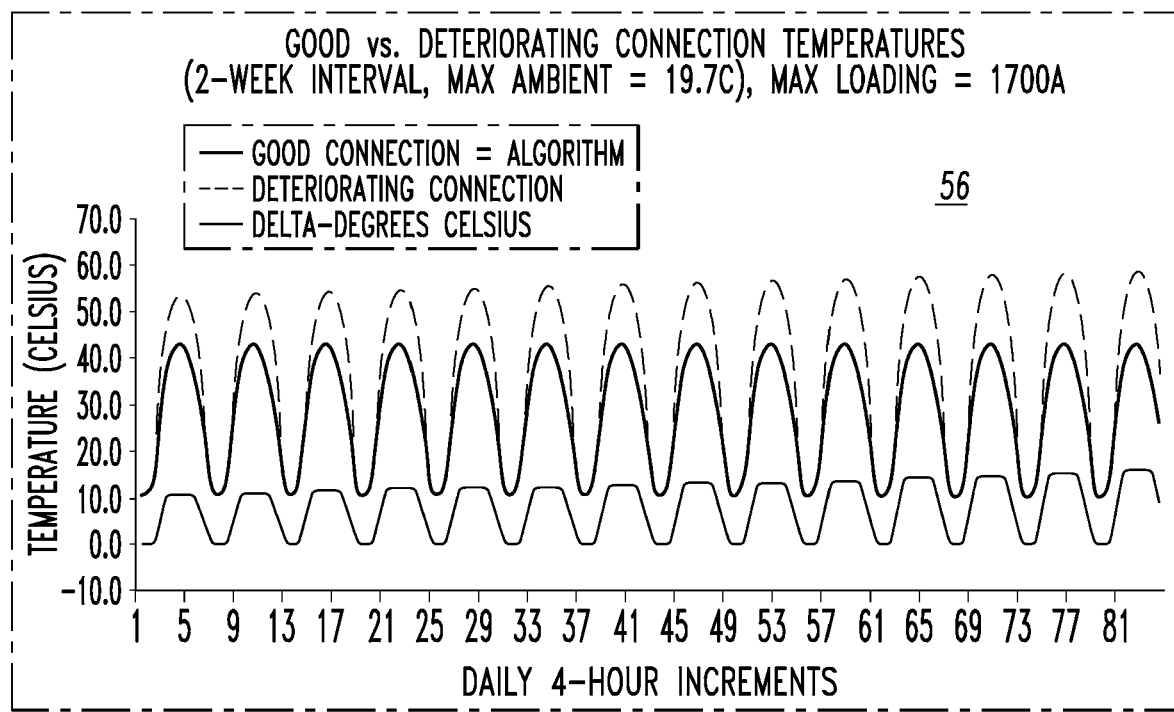
FIG. 8 is a plot of another algorithm to generate alarm thresholds or set points based upon historical data for a non-deteriorating electrical connection or electrical component as contrasted with current data of a deteriorating electrical connection or electrical component in accordance with other embodiments of the invention.

FIG. 8 shows the use of historical data 56, which has a maximum temperature of about 428 C for a "good" electrical connection. The historical data 56 indicates, in this example, a set point 24 (e.g., an alarm threshold) of about 558 to about 608 C An algorithm of the expert system 46 (FIG. 1) employs the actual data from the deteriorating electrical connection to generate an alarm 26 or recommendation 44 for an immediate inspection and/or maintenance when the temperature crosses the example 608 C alarm threshold.

Several specific examples of this are presented. First, there is the deterioration or loosening of an electrical connection between the outgoing or incoming power cable and an equipment bus electrical connection. This electrical connection may have been installed many years prior, without the proper tightness, and with time and temperatures related to current flow, has begun to develop into a high impedance or high resistance connection. Without detection, this slowly overheating connection will eventually begin to overheat nearby insulating materials and create the same or similar failure modes as discussed, above, in Example 26.

Another example is the weakening of the spring tension on the closing contact mechanism of a circuit breaker or contactor. These springs apply pressure between the moving and stationary contacts within a circuit breaker or contactor to ensure a good low-impedance connection when the circuit breaker or contactor is in the closed position. As the contact loses tension, the current flow across the contact area passes across a higher resistance and, therefore, begins to generate higher temperatures. These higher temperatures can further accelerate the weakening of the spring tension and eventual overheating. Two failure modes can result: (1) similar to the overheating of nearby insulation, thereby coating other insulating materials above and creating a fault path; and (2) this overheating at the contact surfaces begins to cause vibrations between the surfaces, further heating and eventually welding the two surfaces together. When the circuit breaker is attempted to be opened, either due to a downstream overload or fault, or due to an operator action, the circuit breaker separable contacts are welded together and will not open. This can cause single-phasing of downstream three-phase loads since one or two of the three phases may not be welded and, therefore, these phases do disconnect, leaving the one-phase connection still connecting the line side of the circuit breaker to the load side, as well as a serious safety concern since individuals may expect that the downstream equipment is de-energized, although it remains energized.

Another example is the weakening of the contact springs on motor starter contactors. These contact surfaces experience the same or similar deterioration, overheating and potential welding as described for circuit breaker contacts. Hence, the same or similar failure modes result.

A further example is the clogging of filters or normal air flow paths. This can result from the accumulation of dirt, debris or contamination both within and outside of switchgear or other electrical equipment 4. Foreign equipment may have been placed against ventilating vents or on top of the electrical equipment 4, preventing the proper air flow. In addition, electrical equipment 4 located in environments where there exists an oil-mist in the air will apply filters to the electrical equipment 4, even if they were not designed for such filters. In any of the above cases, the disclosed system 2 provides a notification 22 of the need for immediate maintenance and/or an inspection.

Another example is detecting the failure of internal heaters for the electrical equipment 4, which heaters are designed to ensure that no humidity can collect within the electrical equipment 4. These heaters do occasionally fail, and the accumulation of humidity does eventually create a conductive path from the energized electrical equipment 4 to ground and a massive internal failure. In other cases, local electrical personnel will inappropriately turn off the heaters during the summer months, since they relate the term "heater" to being needed only in the winter months. Some end-users of electrical equipment have requested that ammeters be installed in the heater circuit, with a remote indication/alarm to identify if a heater has been inadvertently turned off or if a heater has failed. During the failure of an internal heater, the temperature of the associated cubicle or compartment will drop. This drop is detected during the periodic expert analysis by the expert system 46 and the end-user is notified, at 22, of the need for immediate maintenance and/or an inspection. In this case, the suggestion to investigate for heater failure would be included in the recommendation 44.

In these example cases and others, the periodic analysis and algorithm comparisons of the expert system 46 result in the immediate recommendation 44 for an internal inspection and/or an immediate maintenance cycle to address overheated electrical equipment 4, loss of proper air flow, failure of humidity-preventing internal heaters, and/or other possible failure modes.

EXAMPLE 30

An example of immediate maintenance is a detailed thermographic survey to identify the specific source of additional heating within an enclosure of the electrical equipment 4. The system 2 provides a suitable mechanism to provide a notification 22 of when a thermographic survey, or other suitable maintenance, is required versus the known practice of providing periodic surveys.

EXAMPLE 31

Varying load currents, which are normal to most operating electrical equipment 4, tend to shield rising trends, which can be identified using site-specific algorithms and trended past historical data. Preferably, each site-specific and application-specific algorithm of the expert system 46 contains a unique set of parameters that factor in the temperature rise of the electrical equipment 4.

EXAMPLE 32

Examples of the notifications 22 provided by the system 2 to end-users from the algorithms of the expert system 46, which algorithms are based upon past data, include: notification of an immediate need to inspect the electrical equipment 4; notification of the need for near-term maintenance of the electrical equipment 4; and notification of the need for longer-term inspection, upgrading or replacement of the electrical equipment 4. One critical advantage of this approach is that problems can be identified when the loading levels of the electrical equipment 4 are not at their maximum level and, therefore, identify when they occur and not when they have become a major problem or a potential outage.

EXAMPLE 33

Examples of immediate alarms 26 from the system 2 are provided for several key factors: immediate rise in temperature above acceptable or electrical equipment rated levels; presence of water within the electrical equipment room or near the electrical equipment 4; excessive rate of rise of the presence of dust or contaminants; presence of smoke; excessive rate of rise of humidity in or near the electrical equipment 4; motion at or near the electrical equipment 4, when in a secure room or a secure area, which normally restricts entrance; excessive rate of rise of harmonics or other power quality related events; loss of air flow or electrical equipment cooling; loss of outdoor electrical equipment heaters; presence of high load currents; and operation of critical circuit breakers. Any number of the above conditions may be programmed to provide an immediate alarm 26 to the end-user and/or a number of other designated persons.

Example alarm set points 24 and their linkage to either or both of: (a) an immediate alarm 26 of a pending failure; and (b) a notification 22 of the need for an immediate inspection or maintenance are as follows:

humidity: both immediate inspection or maintenance;

dust (relatively slow increase): notification of the need for an immediate inspection and/or maintenance;

dust (relatively rapid increase): immediate alarm of a pending failure;

smoke: immediate alarm of a pending failure;

cubicle temperature (e.g., Example 25): notification of the need for an immediate inspection and/or maintenance;

cubicle temperature (above historical maximum level): notification of the need for an immediate inspection and/or maintenance;

cubicle temperature (below historical minimum level): both;

floor water: immediate alarm of a pending failure;

ground leakage current: immediate alarm of a pending failure;

motion (within the electrical equipment 4): immediate alarm of a pending failure;

motion (external to the electrical equipment 4): both;

load current (exceeding historical maximum levels): both;

load current (below minimal levels, which are utilized to also indicate the opening of a circuit breaker): immediate alarm of critical circuit breaker operation;

circuit breaker operation: immediate alarm of system abnormal operation; and programmed alarm outputs (e.g., via smart relays): depending on the parameter programmed to provide the output contact closure.

Preferably, the system 2 alerts a number of end-users on a 24/7 (24 hours a day, 7 days a week) basis, of the operation of critical electrical equipment 4, such as the opening of a main incoming power circuit breaker, the transfer of power, or the starting of an emergency generator. This permits the end-user to take appropriate immediate action before being notified by conventional methods. For example, certain electrical equipment components support plant environmental systems and immediate notification of a malfunction can be essential to preventing environmental issues including both internal and external plant releases or contamination. In addition, local support personnel can be simultaneously notified and dispatched if required.

EXAMPLE 34

The system 2 preferably employs local data logging by the first processor 8 that is preferably powered by local available power sources with battery back-up for data protection and transmission during a power-outage. The transceiver 12 can be powered by an uninterruptible power supply (UPS) to ensure data transmission during electrical outages.

EXAMPLE 35

The system 2 transfers the locally logged data for receipt by, for example, a web site provided by the second processor 16 for trending and analysis. There, past data is reviewed to provide site-specific and application-specific algorithms of the expert system 46.

EXAMPLE 36

The web site may, preferably, be part of a customer reliability response center, which processes receipt of alarms 26 (e.g., without limitation, smoke; high humidity; high temperature; floor-water; motion; relay programmed outputs), provides a look-up table of end-users, calls the end-user, optionally calls a back-up for the end-user, determines if field support is required, contacts service personnel, contacts engineering personnel for data analysis, and follow-up calls the end-user regarding critical alarms.

While there are a wide range of known individual sensors for various electrical equipment failure indicators, no known system correlates such failure indicators to actual load current and other parameters or provides algorithms to correlate these indicators to each other.

The disclosed system 2 provides an important end-user benefit of providing notifications 22 to perform maintenance when required rather than relying upon conventional time-based or usage-based maintenance. Wireless or landline communications are preferably provided with, for example, e-mail or text message alarm notifications 22, without the need to communicate through end-user firewall-protected networks. Internet transmission of data can also be incorporated.

The disclosed system 2 provides remote monitoring of the condition of the electrical equipment 4, which meets various end-user needs; provides as few outages as possible; lowers capital and maintenance budgets; increases reliability of the electrical equipment 4; identifies unknowns about the current state of the electrical equipment 4; notifies the end-user of when maintenance must be performed or that a potential problem must be investigated; provides early warning failure detection of, for example and without limitation, humidity, smoke, floor water and high temperature; permits the efficient planning of maintenance (e.g., a quarterly trend report identifies high temperatures, which may result in the recommendation for a manual thermographic survey or high dust accumulation as a need for preventative maintenance measures); and provides failure diagnostics (e.g., relay alarm outputs; surge/sag/harmonics; motion) and includes new recommendations for new alarm threshold settings 24 for the sensors 6.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A system for monitoring electrical equipment and providing predictive diagnostics therefor, said system comprising: a number of sensors located at or about said electrical equipment, said number of sensors being structured to sense information pertaining to operation of said electrical equipment; a first processor located at or about said electrical equipment, said first processor being structured to receive said sensed information from said number of sensors as first information; a first transceiver cooperating with said first processor to transmit said first information as transmitted information; a second processor located remote from said electrical equipment; and a second transceiver cooperating with said first transceiver to receive said transmitted information as second information and communicate the same to said second processor, wherein said second processor is structured to provide at least one of: (a) a notification pertaining to an immediate inspection and/or maintenance of said electrical equipment; and (b) a number of set points operatively associated with said sensed information, said number of set points pertaining to a number of potential alarms regarding operation of said electrical equipment; and wherein said second processor is further structured to cooperate with said second transceiver to transmit said number of set points to said first transceiver as a number of transmitted set points; wherein said first transceiver is structured to receive said number of transmitted set points as a number of received set points; and wherein said first processor is further structured to compare a number of said first information to said number of received set points and provide a number of alarms regarding operation of said electrical equipment.

2. The system of claim 1 wherein said first and second transceivers are structured to communicate through one of the group consisting of a global communication network, a cellular telephone network, and a wired telephone network.

3. The system of claim 1 wherein said first processor is further structured to periodically receive said sensed information from said number of sensors; and wherein said first transceiver is structured to periodically transmit said transmitted information to said second transceiver.

4. The system of claim 1 wherein said second processor is further structured to output an alarm pertaining to an immediate or potential failure of said electrical equipment resulting from at least one of: (a) dust, (b) smoke, (c) water, (d) humidity and (e) a combination of at least two of humidity, temperature, water, smoke and dust.

5. The system of claim 4 wherein said second processor is further structured to provide at least one of said alarm and said notification.

6. The system of claim 1 wherein said second processor is further structured to output said notification pertaining to an immediate inspection and/or maintenance of said electrical equipment.

7. The system of claim 1 wherein said first processor is further structured to provide a number of notifications responsive to said number of alarms.

8. The system of claim 1 wherein said number of notifications are selected from the group consisting of a pager message, a text message, and an e-mail message.

9. The system of claim 1 wherein said number of notifications are structured to provide at least one of a notification to an operator of said electrical equipment and a notification to a service person for said electrical equipment.

10. The system of claim 1 wherein said second processor is further structured to provide trend information of said second information with respect to time.

11. The system of claim 10 wherein said second processor is further structured to provide from said trend information at least one of said number of set points, and a recommendation regarding an inspection or maintenance of said electrical equipment.

12. The system of claim 10 wherein said second processor comprises an expert system employing said trend information and said second information.

13. The system of claim 12 wherein said number of sensors are further structured to sense as said sensed information: (a) equipment temperature and load current of said electrical equipment, and (b) at least one of ambient temperature, humidity and dust about said electrical equipment; and wherein said expert system is structured to correlate said equipment temperature to said load current and said at least one of said ambient temperature, said humidity and said dust, in order to provide a unique corresponding equipment operating profile for said electrical equipment as a function of variable conditions and operating modes thereof.

14. The system of claim 13 wherein said second processor is further structured to provide said trend information from said second information with respect to time; and wherein said expert system is further structured to employ said trend information to predict normal operating equipment temperatures of said electrical equipment and to provide an alarm or notification if said electrical equipment operates beyond said predicted normal operating equipment temperatures.

15. The system of claim 10 wherein said second processor comprises a human interface to said trend information and said second information.

16. The system of claim 10 wherein said second processor is further structured to provide from said trend information said number of set points, which pertain to at least one of a maximum operating temperature, a maximum level of dust, a maximum level of humidity and a maximum level of smoke of said electrical equipment.

17. The system of claim 16 wherein said second processor is further structured to cooperate with said second transceiver to transmit said number of set points to said first transceiver as a number of transmitted set points; wherein said first transceiver is structured to receive said number of transmitted set points as a number of received set points; and wherein said first processor is further structured to compare a number of said first information to said number of received set points and provide a number of alarms, which indicate need for inspection or maintenance of said electrical equipment.

18. The system of claim 1 wherein said first processor is structured to be a web client; wherein said second processor is structured to be a web server; and wherein said first and second transceivers are structured to communicate through a global communication network.

19. The system of claim 1 wherein said first processor is structured to provide at least one of: (a) an alarm pertaining to an immediate or potential failure of said electrical equipment; and (b) a notification pertaining to an immediate inspection and/or maintenance of said electrical equipment.

20. A system for monitoring electrical or rotating electrical equipment and providing predictive diagnostics therefor, said system comprising: a number of sensors located at or about said electrical or rotating electrical equipment, said number of sensors being structured to sense information pertaining to operation of said electrical or rotating electrical equipment; a first processor located at or about said electrical or rotating electrical equipment, said first processor being structured to receive said sensed information from said number of sensors as first information; a first transceiver cooperating with said first processor to transmit said first information as transmitted information; a second processor located remote from said electrical or rotating electrical equipment; and a second transceiver cooperating with said first transceiver to receive said transmitted information as second information and communicate the same to said second processor, wherein said second processor is structured to determine a number of set points operatively associated with said sensed information, said number of set points pertaining to a number of potential alarms regarding operation of said electrical or rotating electrical equipment; and wherein said second processor is further structured to cooperate with said second transceiver to transmit said number of set points to said first transceiver as a number of transmitted set points; wherein said first transceiver is structured to receive said number of transmitted set points as a number of received set points; and wherein said first processor is further structured to compare a number of said first information to said number of received set points and provide a number of alarms regarding operation of said electrical or rotating electrical equipment.

21. The system of claim 20 wherein said second processor is further structured to provide an alarm pertaining to an immediate or potential failure of said electrical or rotating electrical equipment.

22. The system of claim 20 wherein said second processor is further structured to provide a notification pertaining to an immediate inspection and/or maintenance of said electrical or rotating electrical equipment.

* * * * *